(12) United States Patent
Salvermoser et al.

(10) Patent No.: US 6,400,089 B1
(45) Date of Patent: Jun. 4, 2002

(54) HIGH ELECTRIC FIELD, HIGH PRESSURE LIGHT SOURCE

(75) Inventors: Manfred Salvermoser, Newark; Daniel E. Murnick, Bernardsville, both of NJ (US)

(73) Assignee: Rutgers, The State University, Somerset, NJ (US)

( * ) Notice: Subject to any disclaimer, the term of this patent is extended or adjusted under 35 U.S.C. 154(b) by 118 days.

(21) Appl. No.: 09/634,403

(22) Filed: Aug. 9, 2000

Related U.S. Application Data

(60) Provisional application No. 60/147,912, filed on Aug. 9, 1999, and provisional application No. 60/157,813, filed on Oct. 4, 1999.

(51) Int. Cl.[7] .................................................. H01J 7/24
(52) U.S. Cl. ............................ 315/111.81; 315/111.91; 313/238; 313/258
(58) Field of Search ...................... 315/111.21, 111.81, 315/111.91; 313/238, 258, 551, 562; 362/262, 545

(56) References Cited

U.S. PATENT DOCUMENTS

| 4,230,994 A | 10/1980 | Bradley | 331/94.5 |
|---|---|---|---|
| 4,665,526 A | * 5/1987 | Shipman, Jr. et al. | 315/111.21 |
| 4,746,799 A | * 5/1988 | McMillan | 315/111.81 |
| 5,686,789 A | 11/1997 | Schoenbach et al. | 313/491 |
| 6,052,401 A | 4/2000 | Wieser et al. | 372/74 |

* cited by examiner

Primary Examiner—Don Wong
Assistant Examiner—Jimmy T. Vu
(74) Attorney, Agent, or Firm—Lerner, David, Littenberg, Krumholz & Mentlik, LLP

(57) ABSTRACT

A method of generating light comprising the step of applying an electric field to an excimer-forming gas such as a gas mixture containing noble gases and hydrogen or halogen, and providing free electrons in the gas. The electric field is configured to accelerate electrons to at least the energy required to form excimers, but in at least one region of the electric field, the field does not substantially ionize the gas, so that the field does not induce arcing through the gas. For example, electrons can be injected from one or more field emission electrodes (18) such as one or more a metal needle tip conductors, whereas the electric field can be a field between the field emission electrodes and a counterelectrode (13).

40 Claims, 10 Drawing Sheets

HIGH ELECTRIC FIELD, HIGH PRESSURE LIGHT SOURCE

The present application claims the benefit of U.S. Provisional Patent Applications No. 60/147,912, filed Aug. 9, 1999, and No. 60/157,813, filed Oct. 4, 1999, the disclosures of which are hereby incorporated by reference herein. The disclosure of U.S. patent application Ser. No. 08/873,957 filed Jun. 12, 1997, now U.S. Pat. No. 6,052,401, is also incorporated by reference herein.

FIELD OF THE INVENTION

The present invention relates to methods and apparatus for generating light such as ultraviolet light from excimer-forming gases.

BACKGROUND OF THE INVENTION

There has been a need for improved light sources capable of generating ultraviolet light in the spectral region of between about 50 and 200 nanometers wavelength, commonly referred to as the "vacuum ultraviolet" or "VUV" region. VUV photons have energies on the order of 10 electron volts (10 eV) and are capable of breaking chemical bonds of many compounds. Thus VUV light can be used to accelerate chemical reactions as in chemical vapor deposition, curing of photosensitive material, production of ozone, and cracking gaseous waste products. Moreover, the minimum feature size that can be imaged with light is directly proportional with the wavelength of the light. VUV light has the shortest wavelength of any light that can be focused and reflected with conventional optical elements. Therefore, photographic processes employing VUV lights can image smaller feature sizes than those imaged with other light wavelengths. This is of particular importance in photographic processes used to fabricate semiconductors. In addition, such microimaging of features requires high brightness of light sources with such short wavelengths.

Additional needs exist for broadband VUv light sources, i.e., light sources which emit the VUV light over a continuum of wavelengths within the VUV range. A broadband source can be used for absorption spectroscopy in the VUV range. Because gases such as hydrogen and oxygen have resonance lines in this range, VUV absorption spectroscopy can be used for sensitive analytical measurements. A light source for use in spectroscopy desirably can operate continuously, with stable emission characteristics over time. A stable, continuously operable broadband VUV source is also needed for use as a calibration standard, for measuring the sensitivity of VUV light detection systems in laboratory apparatus.

Deuterium arc lamps have been used as VUV light sources. However, such lamps emit a relatively weak continuum or broadband radiation in the VUV range together with intense line radiation at particular wavelengths. This spectral characteristic requires that the detector system used to measure the light have a very high dynamic range, i.e., the capability of measuring a weak light at some wavelengths and very intense light at others.

Some consideration has been given to the use of excimer radiation as a source of UV light. Excimers are temporary chemical compounds composed of atoms that normally do not combine with one another. One or more of the atoms constituting an excimer is an excited state, i.e., a state in which the [electrons have] atom has been momentarily promoted to a higher energy state as, for example, by promoting one or more electrons to higher-energy orbitals. The excimer molecule as a whole is also in an excited state, and will ultimately decay to yield the constituent atoms. For example, elements commonly referred to as inert gases, helium, neon, argon, krypton and xenon, which normally exist only as isolated atoms can form excimer molecules when in the excited state. Diatomic inert gas excimers such as $Ar_2^*$, $Kr_{2^*}$ and $Xe_{2^*}$ emit relatively broadband continuum radiation in the VUV range. However, to form these excimers in appreciable quantities, it is necessary to provide excitation energies on the order of 10 to 40 electron volts per atom. Moreover, this excitation energy must be provided while the gas is maintained at relatively low temperatures, typically below 200° C. and most typically about room temperature. The gas also should be maintained under appreciable absolute pressure, desirably at least about 100 millibars (mbar) and most preferably about 0.5 bar or more, i.e., most preferably at about atmospheric pressure or more. Such substantial gas pressure is needed to provide a dense gas, which facilitates the excimer forming reactions. A simple direct current electrical arc discharge is ineffective to form excimers under these conditions. Other specialized arc discharge arrangements such as surface barrier discharges or arcs applied in short pulses can produce excimer light, but these devices operate only intermittently and do not provide stable, continuous emission.

Co-pending commonly assigned application Ser. No. 08/873,957, now U.S. Pat. No. 6,052,401, addresses the use of applying electron beams to gases to produce excimers to produce such broadband VUV light. However, all such electron beam approaches require the separate creation of an electron beam. It would be desirable to avoid the space and expense of producing an electron beam when creating the VUV light. Furthermore, the window for electron beam entry into the emission chamber still places limitations on the light source. Therefore, there is a need for broadband VUV light sources and monochromatic VUV light sources which can be produced at less expense and take up less space.

SUMMARY OF THE INVENTION

One aspect of the present invention provides methods of forming excimers in a gas. A method according to this aspect of the invention desirably includes the steps of providing free electrons in the gas disposed within a volume and imposing an electric field within such volume so as to accelerate the free electrons within the gas. The electric field is configured so that within a first region of said volume, said free electrons have mean energy equal to or greater than the excitation energy required for excimer formation. However, the field is configured so that within at least one region of the volume, the free electrons have mean energy less than the ionization energy of the gas. Stated another way, the field is configured so that any path through the electric field from negative potential to positive potential passes through at least one region of the volume in which the field is less than the field required to substantially ionize the gas. Thus, the free electrons excite the gas and form excimers without causing breakdown and arcing within the volume.

For example, the step of providing an electric field may include providing a point electrode within the volume and providing a counterelectrode remote from the point electrode, and imposing the electric field between the point electrode and the counterelectrode. As further discussed below, the field is very high in the immediate vicinity of the point electrode, but declines rapidly with distance from the point electrode. In this arrangement, free electrons may be provided in the gas by emission from the point electrode.

The field immediately adjacent to the point electrode typically is so large that the mean energy of the electrons is far above the ionization potential of the gas, and the gas is substantially ionized and heated. The high temperature prevailing in this innermost region inhibits excimer formation in this region. In another region of the gas, immediately surrounding the innermost region, mean energy of the electrons is lower, and the temperature of the gas is lower. In this region, the field is such that the mean energy ranges from slightly above the ionization energy of the gas to below the ionization energy but above the excitation energy required for formation of the excimers. Substantial excimer formation occurs in this region. In yet another region, extending from the outside of the excimer-forming region to the counterelectrode, the field is below the excitation energy of the excimers and hence far below the ionization energy of the gas.

In another embodiment, an additional electrode may be provided. For example, the additional electrode and the counterelectrode may be provided as a pair of parallel plate electrodes. A substantially uniform field is maintained between the additional electrodes and the counterelectrode, with the counterelectrode being at a positive potential with respect to the additional electrode. This field has a substantially constant magnitude such that within this field, free electrons have mean energy equal to or greater than the excitation energy required to form the excimer but less than the ionization energy of the gas. Here again, a negative potential is applied to the point electrode and there is a high field in the immediate vicinity of the point electrode. There may be substantial ionization of the gas in the immediate vicinity of the point electrode. The point electrode and the surrounding ionized gas serve as a source of free electrons. Here, however, substantial excimer formation occurs within a region which extends from the outside of the innermost, hot region immediately surrounding the point electrode all the way to the counterelectrode.

The excimers decay and emit light, typically ultraviolet light, specifically in the vacuum ultraviolet region of the spectrum. Thus, a further aspect of the present invention provides methods of generating light such as VUV light. Typically, the gas is contained within a chamber, and the light is directed outside of the chamber through a window transparent to the light generated by the excimers.

Because the gas remains substantially non-ionized in at least some regions within the volume, there is no arcing or uncontrolled dielectric breakdown of the gas. The electrical discharge or electron flow from the point electrode has properties resembling those of a resistor. That is, the electron current increases with the applied voltage between the point electrode and the counterelectrode. The discharge is stable and can operate at steady state to provide a continuous source of excimers and continuous illumination. Moreover, multiple point electrodes can be operated in parallel to increase the amount of excimer formation and to increase the amount of light emission.

Preferred methods according to this aspect of the invention provide a new VUV light source which can operate at high gas pressures within the chamber or gas volume, because no window is needed for electron beam excitation. As high gas pressures contribute to excimer formation and discourage the formation of plasma conduits which lead to arc discharge, this allows a substantially brighter and smaller source of VUV light that has been previously available.

In further variants, multiple point electrodes connected in parallel can be replaced by an elongated electrode such as a wire or blade. The term "field emission electrode" is used herein to denote an electrode which can emit electrons into the gas. Typically, such an electrode has a relatively small radius in one dimension (such as a blade or wire) or in two dimensions (such as the point of a needle) and provides a high local electric field in the vicinity of the electrode. Here again, a high field magnitude is provided in the vicinity of the elongated electrode. In still other embodiments, the source of free electrons does not include an electrode which provides a locally high field magnitude. For example, electron sources such as surface plasmas in a localized region of the gas, referred to as a "electron source region", can be employed. Such a plasma can be created by laser excitation. Electron beams can be employed, although the use of electron beams typically requires a beam window and hence limits the gas pressures which can be employed.

Another aspect of the present invention provides an apparatus for generating VUV light. Apparatus in accordance with this embodiment of the invention desirably includes, a chamber for holding a gas, means for providing free electrons in said gas; and means for imposing an electric field within a region of said gas so as to accelerate said free electrons, said electric field being configured as discussed above in connection with the methods.

In one exemplary apparatus, application of voltages of the order of magnitude of 10 kV to a metal needle tip electrode with a radius of curvature of approximately 20 $\mu$m in an excimer-forming gas with a pressure on the order of 1–5 bars will produce VUV light. Although the present invention is not limited by any theory of operation, it is believed that the high negative voltage (on the order of 5 kV to 20 kV) at the needle tip of creates a high electric field around the metal needle tip electrode. This high intensity electric field is believed to generate free electrons through field emission from the metal needle tip electrode. The electric field accelerates these free electrons away from the metal needle tip electrode to an energy needed to cause excimer formation in a gas. These accelerated free electrons will collide with gas atoms or molecules and cause the excitation necessary to generate the VUV emitting excimers in the gas. This embodiment thus uses the phenomenon of point corona discharge (also known as St. Elmo's Fire). It is important in harnessing the phenomena that no arc discharges occur.

These and other objects, features and advantages of the present invention will be more readily apparent from a detailed description of the preferred embodiments set forth below taken in conjunction with the accompanying drawings.

DETAILED DESCRIPTION OF THE PREFERRED EMBODIMENT

Figure 1:
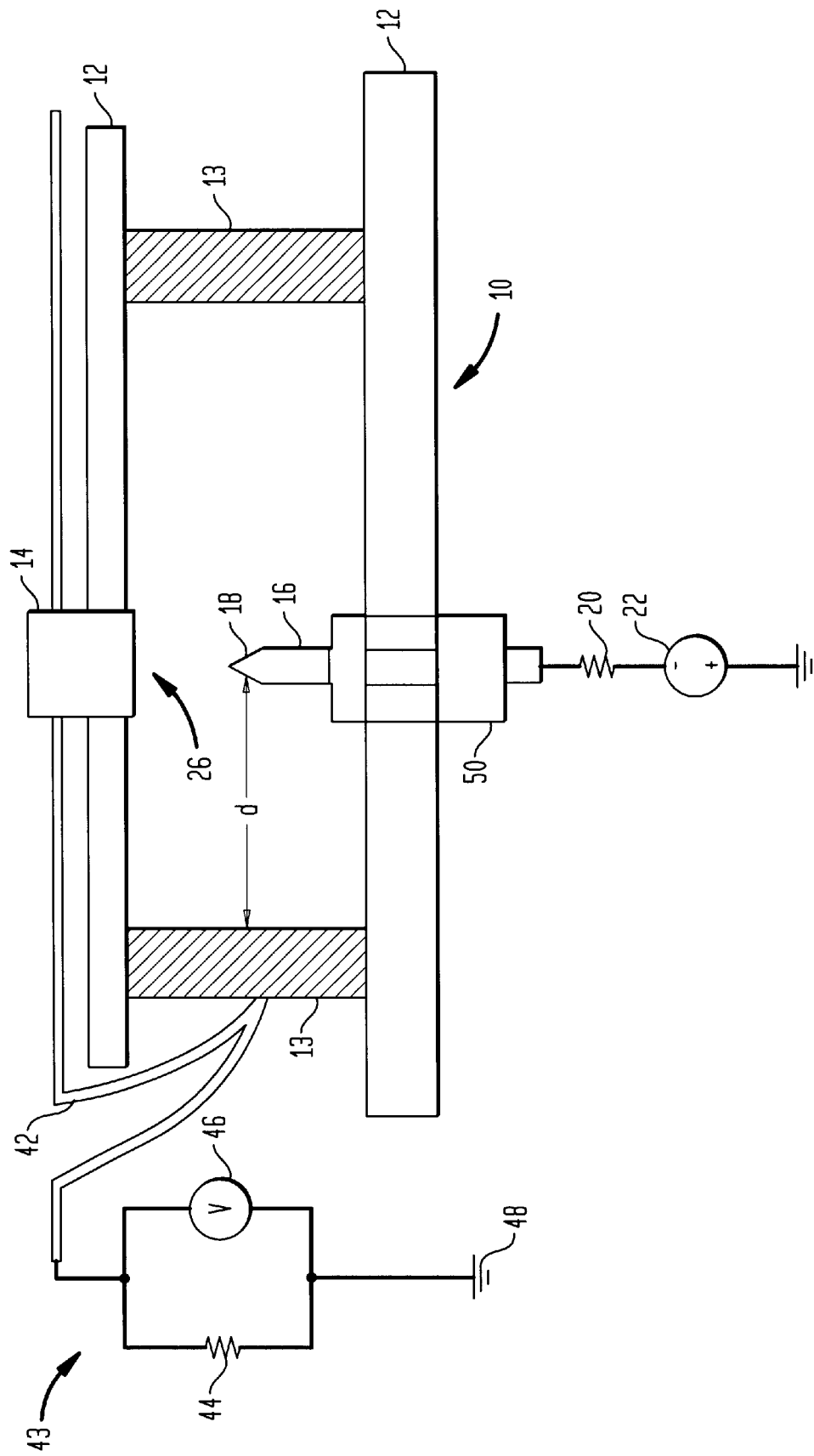
FIG. 1 is a diagrammatic sectional view depicting apparatus according to one embodiment of the invention.

One embodiment of the present invention is an apparatus as depicted in FIG. 1. An apparatus includes an emission chamber 10 having insulating walls 12 and conducting walls 13. The insulating walls 12 may be composed of glass or Plexiglas. The conducting walls 13 may be composed of metals, as, for example, copper. The emission chamber 10 also ha s an optical window 14. The optical window 14 may be composed of $MgF_2$. The window is transparent to the VUV radiation which will be emitted by the gas. A field emission electrode in the form of a metal needle tip 16 is provided which pierces the insulating walls 12, so that the tip 18 is disposed within the internal volume of the emission chamber. The metal needle tip electrode 16 has a sleeve 50 where it pierces the insulating wall 12. This sleeve 50 allows the emission chamber 10 to remain airtight. The tip 18 of the metal tip needle electrode 16 has a radius of curvature $r_{tip}$, and is disposed within the emission chamber 10 a distance from the insulating walls 12 and from conductive walls 13. The metal needle tip electrode 16 is attached to a resistor 20 outside the emission chamber 10. The resistor 20 is connected to a voltage source 22, again outside the emission chamber 10. A circuit-completing ground 24 is attached to conductive walls 13. Thus conductive walls 13 act as a counter electrode.

A conducting layer 42 such as a copper foil is disposed outside of the chamber along one insulating wall 12 and is electrically connected to the conducting walls 13, so that the conducting layer serves as part of the counterelectrode. The counterelectrode, including conducting layer 42 and conductive walls 13, is electrically connected to ground 48. For monitoring purposes, the connection between the counterelectrode and ground passes through an ammeter 43, including a resistor 44 and a voltmeter 46 in parallel with each other.

The voltage source 22 provides a voltage from 0 to −20 kV. The resistor 20 provides 100 MΩ of resistance. The chamber size is on the order of one inch (2.5 cm) to a side. The distance d is ~1 mm. The radius $r_{tip}$ is ~20 μm.

Excimer-forming gas 26 is provided disposed within the emission chamber 10. Emission chamber 10 will of course be as air tight as necessary to contain the excimer-forming gas 26 at high pressure. In general, the gas 26 within the emission chamber 10 can be composed of one or more gases selected from the group of helium, neon, argon, krypton, and xenon. In addition, the gas 26 can also be composed of one ore more gases from the aforementioned group and a second gas different from the first gas. Such a second gas is preferably a halogen or halogen compound. Such second gas is more preferably fluorine or fluorine compound, as noble-gas and fluorine mixtures. For example, mixtures of two or more noble gases and a halogen can be used to form noble gas-halogen excimers. Thus a mixture of argon and helium with fluorine can be excited to from ArF* excimers. Also, neon and hydrogen mixtures can be excited to form NeH* excimers. The gas 26 within the emission chamber 10 is generally at about 2–6 bars of pressure.

Figure 2:
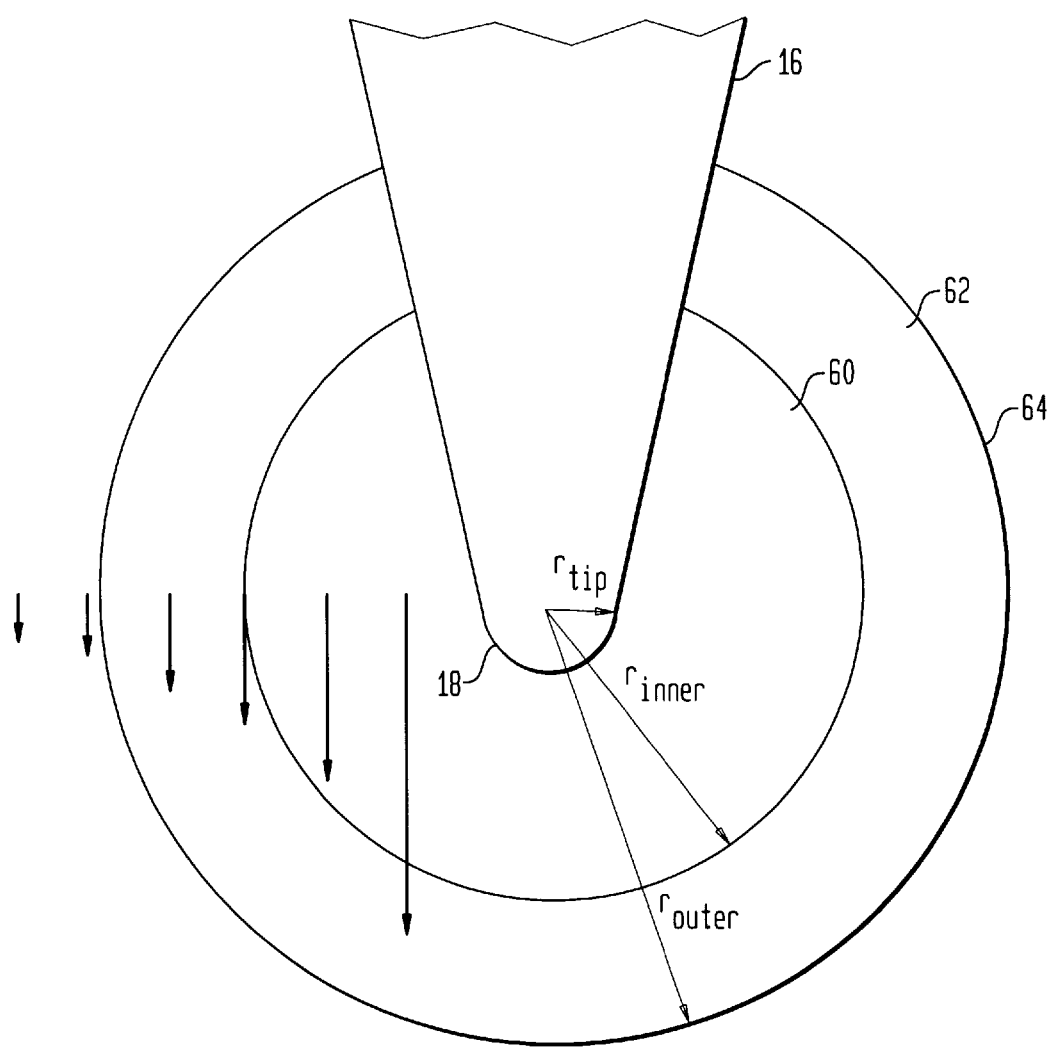
FIG. 2 is a diagrammatic sectional view depicting the point source and surrounding area the embodiment of FIG. 1.
Figure 3:
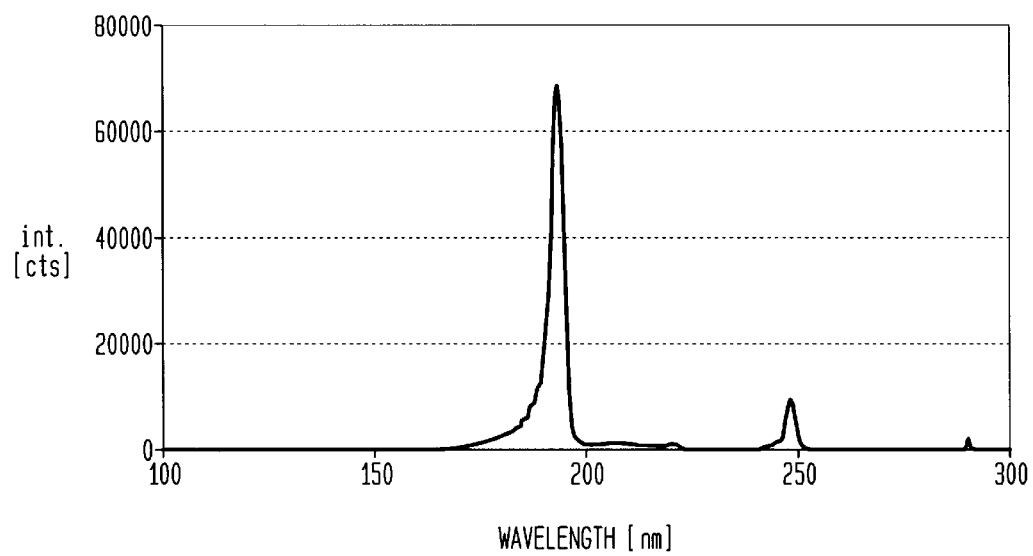
FIG. 3 is a graph showing the spectra of the light emitted from a specific example of the present invention.

FIG. 3 shows the spectra of the light emitted from the apparatus of FIGS. 1 and 2 with a −10 kV voltage applied to field emission electrode 16, using a gas 26 within the emission chamber 10 containing 100 mbar partial pressure Ar, 5 mbar partial pressure $F_2$, and 4 bar partial pressure He. Under these conditions a 13 μA current is detected at ammeter 43. The spectrum clearly shows a peak at 193 nm, consistent with the spectrum line expected from the emission from a gas with ArF* excimers.

Figure 4:
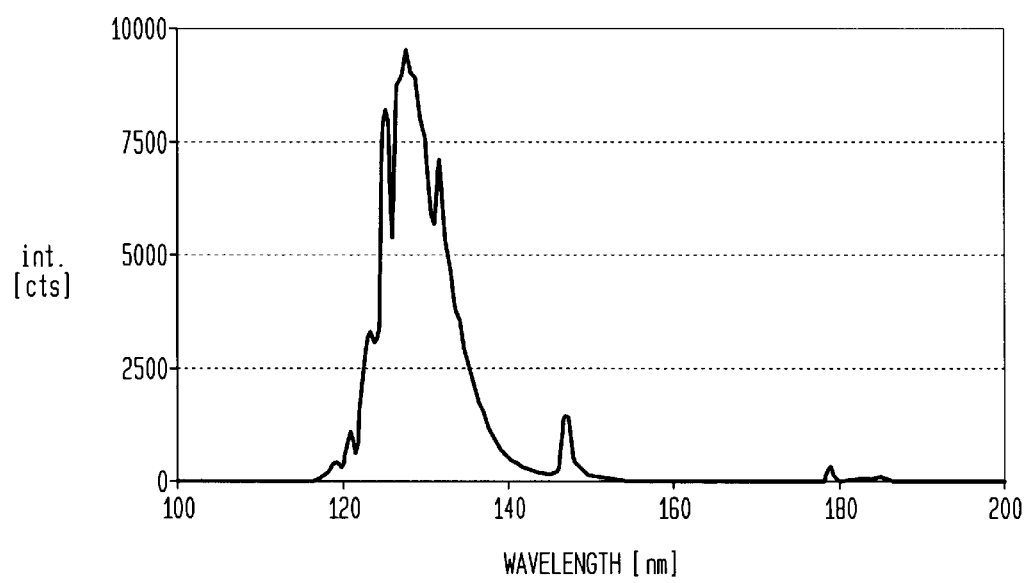
FIG. 4 is a graph showing the spectra of light emitted from a specific example of the present invention.

Similarly, FIG. 4 shows the spectra of light emitted from the same apparatus using a gas containing, 3.6 bar Ar, and 3 bar He. The voltage 13 kV was applied with a current 30 μA recorded. The spectrum clearly shows a peak at 128 nm, which is the expected peak from an emission from $Ar_2$* excimers.

Spectra showing peaks at 248 nm ($Kr_2$*), 172 nm ($Xe_2$*) and 248 nm (KrF*) have been observed. Essentially any excimer VUV radiation can be generated by the present invention by using the appropriate gas mixture.

In operation, the voltage can be applied continuously, and a continuous emission of light is seen. Over a larger time scale, the current may begin to drop gradually. Although the present invention is not limited by any theory of operation, it is believed that this gradual decline is related is related to impurities in the gas. This decline can be suppressed by using highly purified gases and by continually replacing the gases with a relatively slow flow of fresh gases through the chamber. Where the gas mixture consists essentially of noble gases, this decline can be suppressed by incorporating a "getter" such as a heated tungsten filament which reacts with impurities within the chamber. With such measures, the emission remains substantially constant for many hours.

While the present invention is not limited by any theory of operation, the demonstrated results below may be interpreted in the following way. The high negative voltage applied to the tip 18 of the metal needle tip electrode 16 creates a high intensity electric field around the tip. This electric field is enhanced by the geometry of the tip 18. In essence, tip 18 will act as a point source for a field. The tip 18 will display the phenomena of field emission, and emit free electrons. The electric field will then accelerate the free electrons. At certain electric field strength, the free electrons will be accelerated enough to have enough energy to cause excimer formation. This is the "ignition", when the apparatus will begin to emit VUV light from the decay of excimers. As excimers begin to emit VUV light, they will decay to their constituent parts, other excimers will form until a steady state of emission and creation is achieved.

However, it is believed that in this point source geometry that the electric field strength closest to tip 18 will be strong enough to cause ionization, resulting in a double sphere structure. FIG. 2 shows this structure. The arrows in FIG. 2 represent the magnitude of the electric field at various points. The field strength is highest immediately adjacent the tip, and decreases with the square of the distance r from the tip. An inner sphere 60 has a range from the tip to a given radius $r_{inner}$. Within this region, free electrons are accelerated to a mean energy substantially higher than the ionization energy of the gas. Stated another way, the work done by the field on an electron moving along a path length equal to the mean free path of an electron between collisions with gas molecules is substantially greater than the ionization energy of the gas. Within this region, the gas is at a high temperature and excimer formation is limited. In the outer sphere 62, between $r_{inner}$ and $r_{outer}$, the free electrons are accelerated to a mean energy slightly above the ionization energy of the gas, and above the excimer formation energy of the gas. In the region outside the outer sphere 66, the electric field strength is insufficient to give the free electrons the mean energy to cause excimer formation. Therefore, excimer formation will occur principally within outer spherical shell 62, and this shell will show emission of VUV light. The region 64 will be the coolest, and show little excimer formation and ionization. If $r_{outer}$ should be increased to the point where is touches the counterelectrode, arc discharge would occur due to break down of the gas 26. It should be appreciated that the inner sphere 60 and outer shell 62 are not sharply bounded; at $r_{inner}$ and $r_{outer}$; these regions merge gradually into one another. Also, there is some ionization immediately outside of $r_{outer}$. Therefore, to reliably prevent arcing, $r_{outer}$ should be considerably smaller than the distance to the counterelectrode.

The limit of the outer shell 62 of excimer formation (the so called the so-called "lamp zone") may be modeled by the equation:

$$r_{outer} = \sqrt{\frac{U \cdot e}{E_i} \cdot r_{tip} \cdot \lambda_F}$$

where $r_{outer}$ is the radius from the point source at which the mean free energy of electrons is insufficient to cause excimer formation, U is the voltage at the tip, e is the elementary charge, $r_{tip}$ is the radius of the tip, $E_i$ is the ionization energy of the gas atoms or molecules, and $\lambda_F$ is the mean free path of the electron. It is believed that some excimer formation occurs outside of $r_{outer}$ as modeled by this equation. That is, within a thin shell just outside of $r_{outer}$, the mean energy of the electrons is below the ionization energy $E_i$ but still above the excitation energy $E_e$ required to form excimers.

Figure 5:
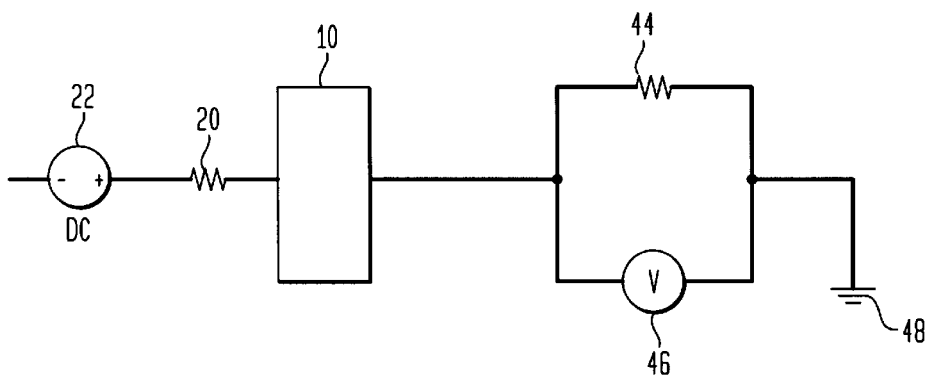
FIG. 5 is a circuit diagram of the effective circuit of a particular embodiment of the present invention.

As corona discharge (ignition) is achieved, a weak current will be established through the conducting wall 13. This allows the completion of a circuit, and the maintenance of the excitation of the gas over a relatively continuous period. The functional circuit created is shown in FIG. 5. This circuit shows that the applied voltage, $U_a$, does not equal the voltage applied at the tip, $U_{tip}$. The circuit shown in FIG. 6 allows us to calculate this $U_{tip}$. In one example in the even more preferred embodiment, application, of –12 kV at the voltage source 22 generates 2 V as detected on voltmeter 46. This indicates 20 μA of current. Therefore, the resistance of the entire circuit, $R_{cir}$, equals 600 MΩ. As the resistor 20 is 100 MΩ, we determine that the resistance of the emission chamber is ~500 MΩ. Therefore, the voltage at the tip 18, $U_{tip}$, equals ~10 kV. Also, we see that the Utip will be some constant fraction of the $U_a$ for a given experimental set up. Thus the relationship will be linear.

As the applied voltage is increased, the size of the lamp zone and the brilliance of the resultant VUV light source will increase. However, a maximum applied voltage exists, the breakdown voltage. At this voltage, the gas under goes dielectric breakdown, the emission ceases and the current ceases. The composition of gas 26, the pressure of gas 26, and the distance d determine the break down voltage. By way of example, in the more detailed embodiment, Xe gas at 5 bars of pressure demonstrates a breakdown voltage at about 20 kV.

Figure 6:
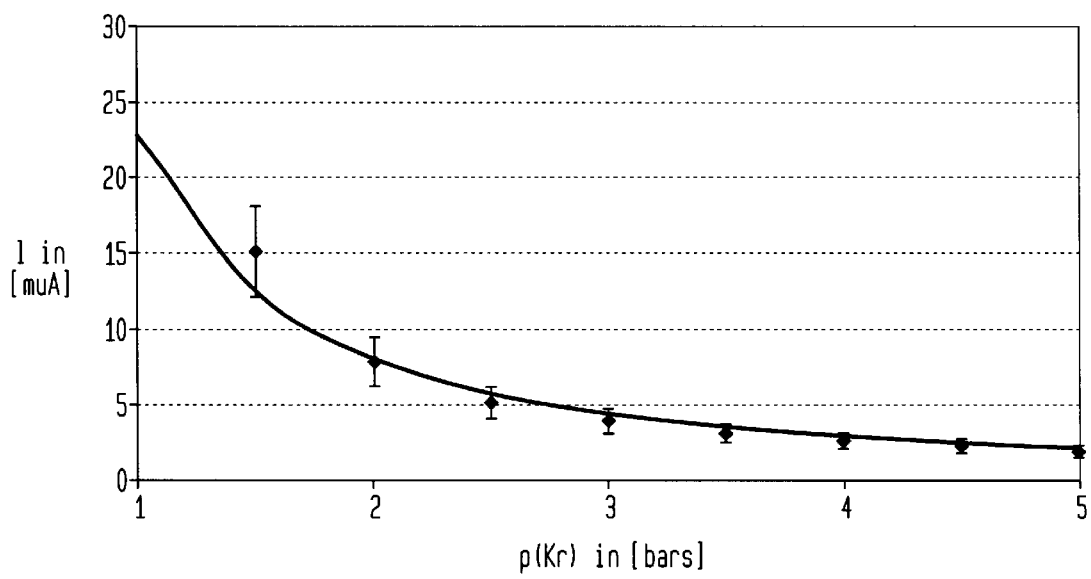
FIG. 6 is a graph showing the relationship between current and gas pressure for a specific example of the present invention.
Figure 7:
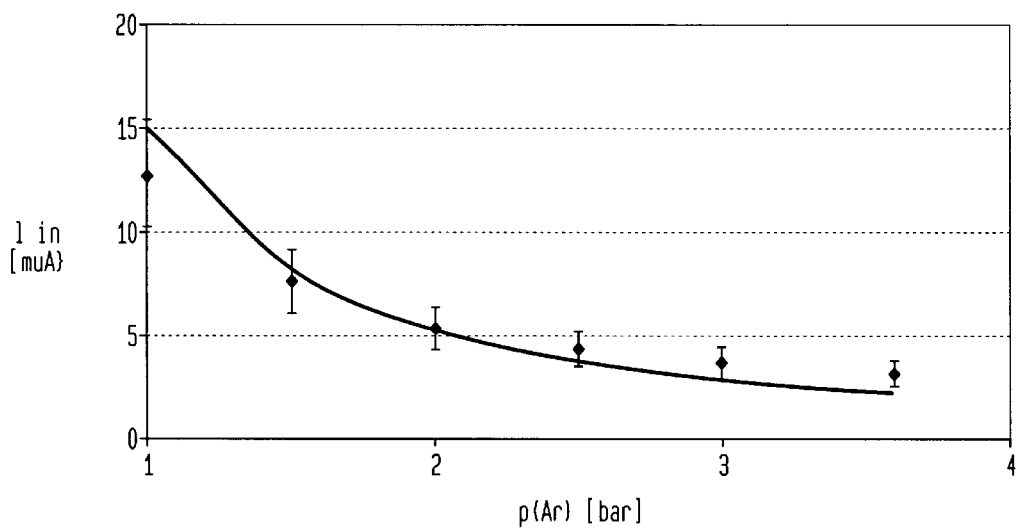
FIG. 7 is a graph showing the relationship between current and gas pressure for a specific example of the present invention.
Figure 8:
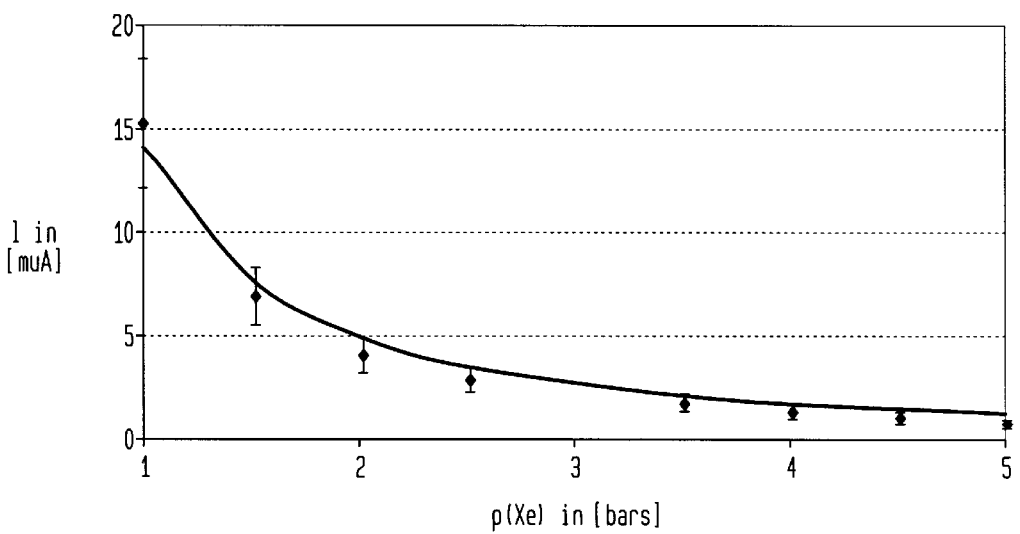
FIG. 8 is a graph showing the relationship between current and gas pressure for a specific example of the present invention.

FIGS. 6–8 demonstrate the dependence between the detected current (in μA) and the gas pressure (in bars) in the apparatus of FIG. 1 for a given gas and applied voltage. FIG. 6 shows the relationship for Kr at 7 kV. FIG. 7 shows the relationship for Ar at 4 kV. FIG. 8 shows the relationship for Xe at 6 kV. In each case, the curves reveal a decrease in detected current as gas pressure is increased.

Figure 9:
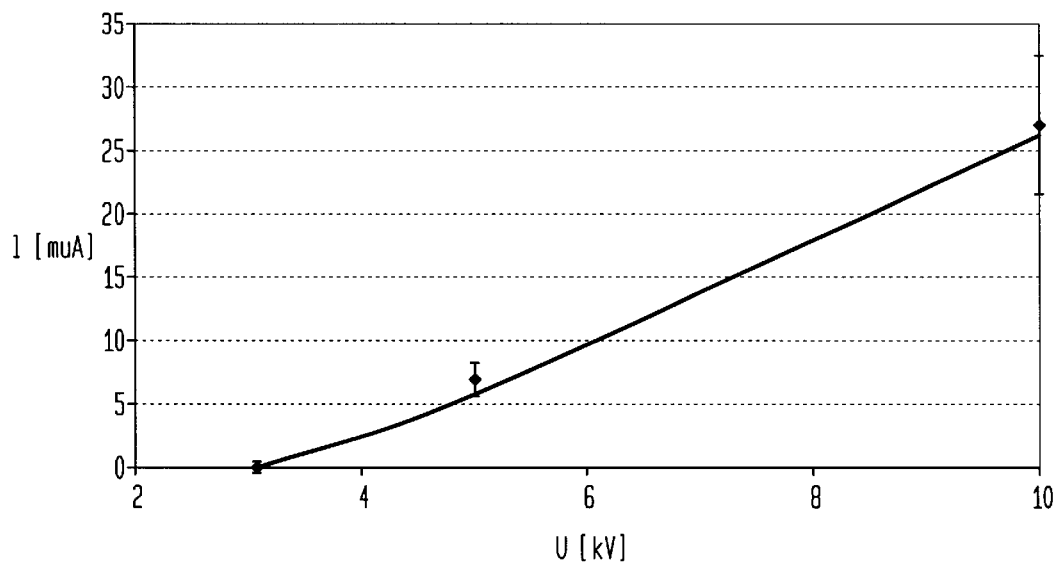
FIG. 9 is a graph showing the relationship between current and applied voltage for a specific example of the present invention.
Figure 10:
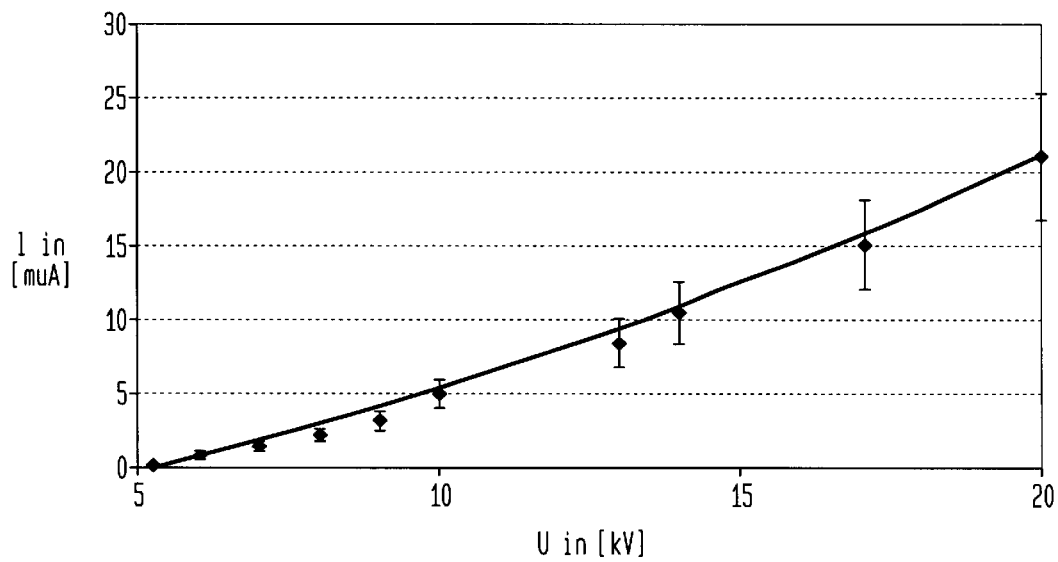
FIG. 10 is a graph showing the relationship between current and applied voltage for a specific example of the present invention.

FIG. 9 and FIG. 10 demonstrate the relationship between the detected current and the applied voltage for a given gas and gas pressure. FIG. 9 shows the relationship for Ar at 3.6 bar pressure. FIG. 10 shows Xe at 5 bar pressure. In each case, an increase of applied voltage yields an increase in detected current.

The above relationships between current, voltage and pressure can be summarized in the following approximate scaling law:

$$I \propto (r_{outer}^3 - r_{tip}^3) \propto (U - U_{ign})^{\frac{3}{2}} \propto p^{-\frac{3}{2}}$$

where I is the current, $r_{outer}$ is the distance from the point source, $r_{tip}$ is the radius of curvature of the tip 18, U is the voltage at the tip, $U_{ign}$ is the voltage at the tip at which corona point discharge starts, and p is the pressure.

Figure 11:
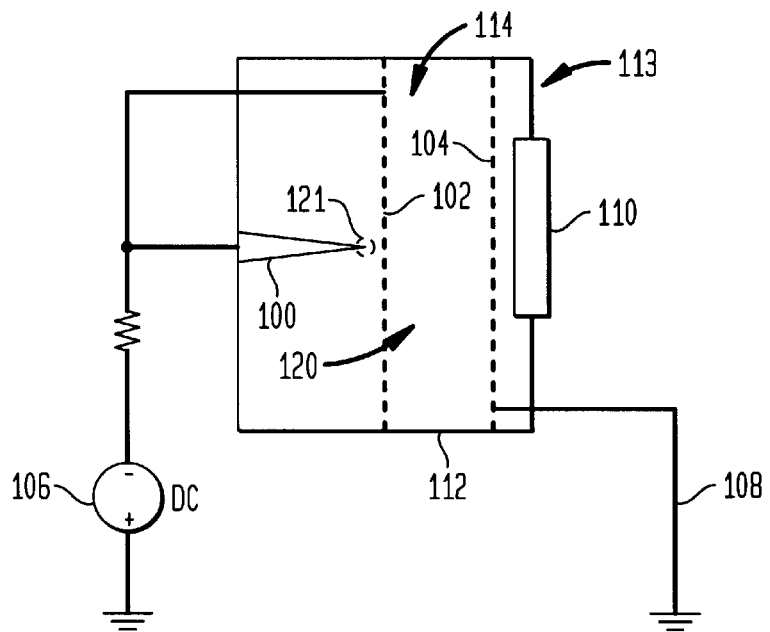
FIG. 11 is a diagram of another embodiment of the present invention, this embodiment having three electrodes.

In another embodiment is shown in FIG. 11. In this embodiment both a metal needle tip electrode or field emission electrode 100 and a planar additional electrode 102 are held at a negative potential. The planar additional electrode 102 is held a constant distance from the planar counterelectrode 104. The metal needle tip electrode 100 and the planar additional electrode 102 are provided with a negative potential by voltage source 106. The circuit is completed by a connection to ground 108. An optically transparent window 110, such as a window of $MgF_2$, is provided to allow VUV light to escape. Planar counter electrode 104 may be a wire mesh as shown in order to allow UV light through. Only some walls 112 of the chamber 113 are illustrated in FIG. 11; in practice, the walls extend entirely around the chamber, and enclose the gas 114 in an airtight manner. In operation, the metal needle tip electrode 100 emits free electrons through field emission. The planar additional electrode 102 may be wire mesh as shown, which allows the free electrons emitted to pass through. The additional electrode 102 and counter electrode 104 create an approximately constant electric field between them. At the correct applied voltage, the electric field produced will be less than the ionization energy of the gas inside the chamber but more than the energy necessary for excimer formation. This avoids arc discharges while allowing excimer formation. In a specific example, 2.5 bar Xe is provided. The planar additional electrode 102 and the planar counterelectrode 104 are kept 5 mm apart. A potential of –9 kV is applied to the additional electrode 102 and to field emission electrode 100, and 17 μA is read as the resulting current. 172 nm excimer radiation is detected in this example, in accord with radiation expected from $Xe_2^*$.

Thus, in this embodiment, the region 121 immediately surrounding the tip of the field emission electrode serves principally as a source of free electrons. Excimer formation occurs principally within region 120, remote from the tip, under the influence of the field applied between additional electrode 102 and counterelectrode 104.

Figure 12:
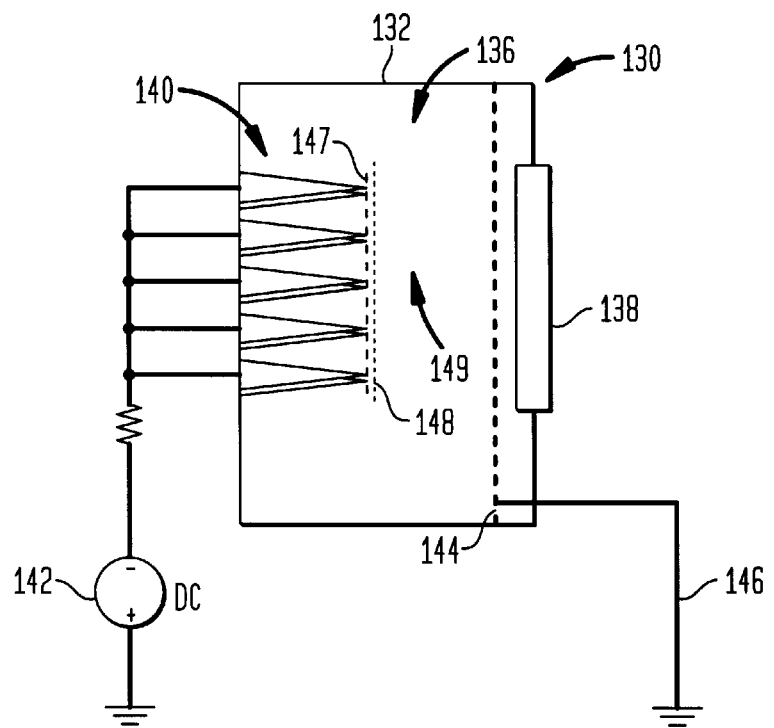
FIG. 12 is a diagram of another embodiment of the present invention, this embodiment having two electrodes and one virtual electrode.

In yet another embodiment a plurality of field emission electrodes, such as a plurality of metal needle tip point electrodes, are run simultaneously in parallel to increase total output intensity. The plurality of field electrodes may be arrayed in a line or in a planar grid. FIG. 12 shows this embodiment. An emission chamber 130 has walls 132 which contain the gas 136. Only some walls 132 of the chamber are illustrated in FIG. 11; in practice, the walls extend entirely around the chamber, and enclose the gas 136 in an airtight manner. A transparent window 138 allows VUV radiation to pass though. A plurality of metal needle tip point electrodes 140 are arrayed in a planar grid. They are attached to a voltage source 142. The planar counterelectrode 144 is attached to a ground 146 to complete the circuit. Again, the planar counterelectrode 144 may be wire mesh to allow through the emitted VUV light.

The ends of the plurality of metal needle tip electrodes 140 define a surface 147. A small distance from this surface a substantially equipotential plane 148 will exist. The equipotential plane 148 acts as a virtual planar electrode, giving results similar to the additional electrode 102 in the embodiment of FIG. 11. Thus, the region immediately surrounding each field emission electrode serves as a source of free electrons, whereas the array of field emission electrodes and counterelectrode 144 apply a field so that in a region 149, the field produces excimer formation without substantial ionization.

Figure 13:
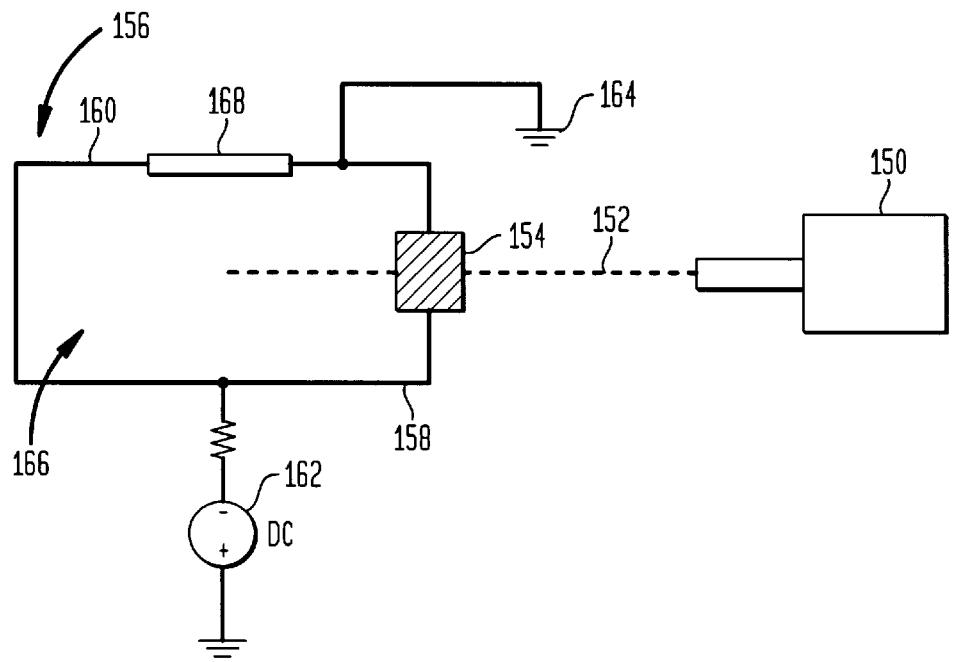
FIG. 13 is a diagram of another embodiment of the present invention, this embodiment having an electron gun.

An arrangement of electrode and counterelectrode can be used with other sources of free electrons as, for example, with an electron gun for injecting free electrons into the space between the electrodes. FIG. 13 shows an electron gun 150 passing a bream of electrons 152 through an electron window 154 of an emission chamber 156. The electrode 158 is connected to a voltage source 162. The counter electrode 160 is connected to a ground 164 to complete the circuit. The emission chamber 156 contains gas 166 in an airtight manner, and has a VUV transparent window 168. In operation, the voltage source 162 applies a voltage necessary to create an approximately constant electric field between electrode 158 and counterelectrode 160. The electron beam 152 provides free electrons. The free electrons are excited by the constant electric field sufficiently to form excimers, and thus generate VUV light.

Figure 14:
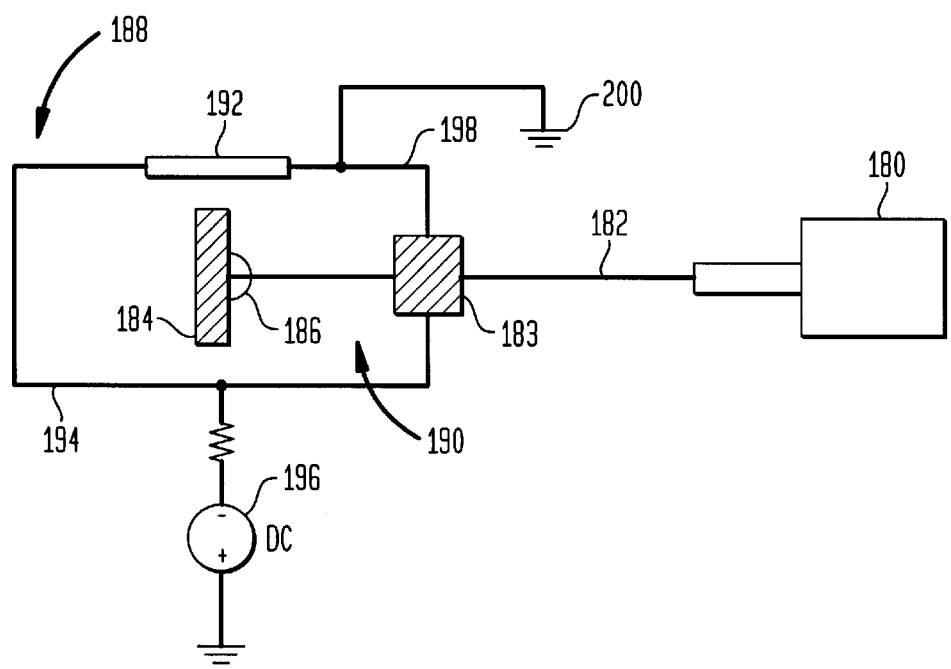
FIG. 14 is a diagram of another embodiment of the present invention, this embodiment having a laser-generated plasma.

In another alternative embodiment as shown in FIG. 14, a laser 180 is used to create a laser beam 182. The emission chamber 188 contains a target 184 and gas 190 in an airtight manner. It has a laser window 183 and a VUV transparent window 192. The electrode 194 is connected to a voltage source 196, while the counterelectrode 198 is connected to a ground 200, completing the circuit. In operation, a voltage is applied by the voltage source 196 to create an approximately constant electric field between electrode 194 and counterelectrode 198. The laser beam 182 passes though the laser window 183 and impinges the target 184, and generates plasma 186. The plasma 186 is a source of free electrons. The free electrons are excited by the constant electric field sufficiently to form excimers, and thus generate VUV light. The present invention can by implemented with essentially any source of free electrons which can be employed.

Figure 15:
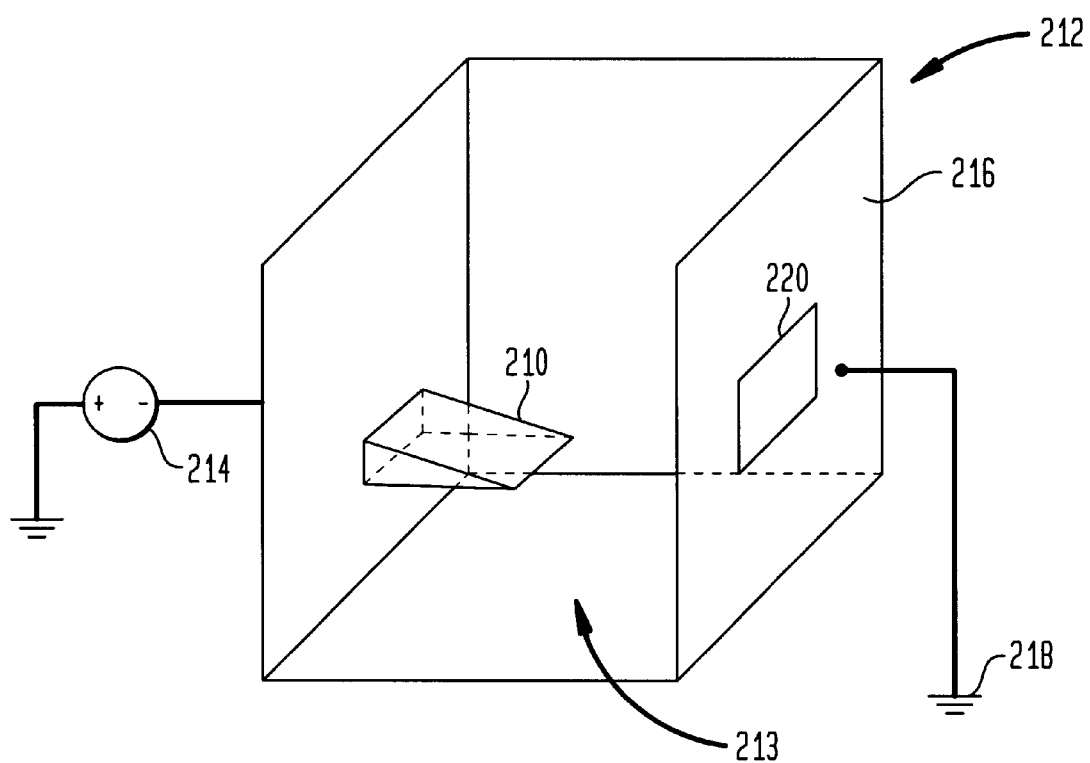
FIG. 15 is a diagram of another embodiment of the present invention, this embodiment having a blade electrode.

In yet another embodiment, the multiple tips described above can be arrayed in a line. In yet another alternative embodiment, blade or wire is used rather than a needle tip, allowing the production of a cylindrical light source. FIG. 15 shows such a blade electrode 210 in a chamber 212. The chamber holds a gas 213 in an airtight manner. The blade electrode 210 is attached to a voltage source 214. A counterelectrode 216 is electrically connected to a ground 218 to complete the circuit. An optically transparent window 220 allows the transmission of VUV light. In operation, the blade electrode 210 will generate a local, high-magnitude electric field in the vicinity of the blade edge. In other respects, this embodiment is similar to the embodiment of FIG. 1.

Figure 16:
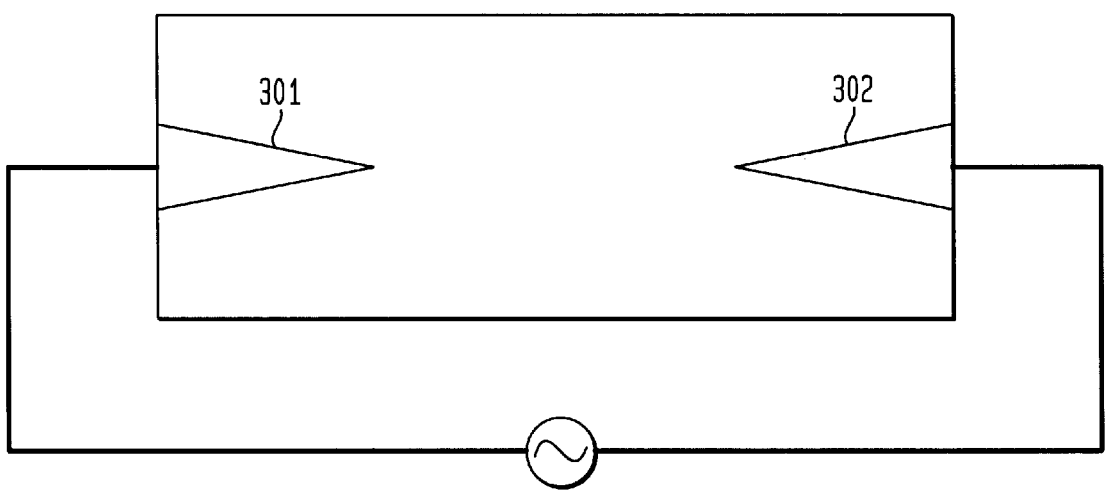
FIG. 16 is a diagram of another embodiment of the present invention, this embodiment having an AC power source.

In the arrangements discussed above, constant DC potentials are applied. Pulsating or varying DC potentials can be employed to provide a pulsating or modulated light intensity. Also, alternating potentials can be applied. Where an alternating potential is applied in an embodiment which uses field emission from an electrode, both electrodes should be capable of acting as field emission electrodes. For example, as shown in FIG. 16, an alternating potential can be applied between a first electrode 301 and a second electrode 302. When the first electrode 301 is negative with respect to the second electrode 302, the first electrode serves as the field emission electrode and the second electrode acts as the counterelectrode. When the potential is reversed, electrode 302 acts as the field emission electrode and electrode 301 acts as the counterelectrode. The AC potential may be at a high radio frequency. Use of a radio frequency potential minimizes sputtering and minimizes damage to the electrodes.

In the arrangements discussed above, a window is used to allow the VUV light to escape from the chamber, so that the light can interact with objects outside of the chamber. In other embodiments, the VUV light can be utilized within the chamber as, for example, to treat an object disposed within the chamber. For example, $Ne_2^*$ can be used to emit 80 nm radiation, which can not be transmitted currently any material, for such an application. In still other embodiments, the excimers created as discussed above can be employed without using light emitted by decay of the excimers.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. A method of forming excimers in a gas comprising the steps of:
   (a) providing free electrons in said gas; and
   (b) imposing an electric field within a region of said gas so as to accelerate said free electrons, said electric field being configured so that (i) within a first region of said gas, said free electrons have mean energy equal to or greater than the excitation energy required to form the excimer and (ii) within at least one region of the gas, said free electrons have mean energy less than the ionization energy of the gas, whereby said free electrons excite the gas and form excimers without causing arcing.

2. A method as claimed in claim 1 wherein said step of providing an electric field includes providing a field emission electrode within the gas and providing a counterelectrode remote from the field emission electrode.

3. A method as claimed in claim 2 wherein said field emission electrode is maintained at a negative potential with respect to the counterelectrode, and said free electrons are injected into the gas from said field emission electrode.

4. A method as claimed in claim 1 wherein said free electrons are injected into the gas from an electron source outside of the gas through an electron-transmissive window.

5. A method as claimed in claim 1 wherein said free electrons are provided by applying electromagnetic radiation to the gas so as to form a plasma in an electron source region of the gas.

6. A method as claimed in claim 1 wherein said free electrons are provided by ionizing the gas in an electron source region of the gas.

7. A method as claimed in claim 1 wherein said gas includes a first gas component selected from the group consisting of He, Ne, Ar, Kr, and Xe and mixtures thereof.

8. A method as claimed in claim 7 wherein said gas consists essentially of said first gas component.

9. A method as claimed in claim 7 wherein said gas includes a second gas component having a composition different from the composition of said first gas component.

10. A method as claimed in claim 9 wherein said second gas component is selected from the group consisting of halogens and hydrogen.

11. A method as claimed in claim 10 wherein said gas consists essentially of Ne and $H_2$.

12. A method as claimed in claim 10 wherein said gas consists essentially of a mixture of at least two gases selected from the group consisting of He, Ne, Ar, Kr, and Xe and a halogen.

13. A method as claimed in claim 1 further comprising utilizing electromagnetic radiation generated by decay of said excimers.

14. A method as claimed in claim 13 wherein said electromagnetic radiation includes ultraviolet light.

15. A method as claimed in claim 1 wherein said gas is maintained at a pressure above about 0.1 atmosphere.

16. A method as claimed in claim 15 wherein said pressure is above about 1.0 atmosphere.

17. A method as claimed in claim 15 wherein said gas in said first region is maintained at a temperature below about 100° C. in said first region.

18. A method as claimed in claim 1 wherein said step of providing an electric field includes providing a counterelectrode and an additional electrode spaced apart from said counterelectrode, and maintaining a potential difference between said counterelectrode and said additional electrode, and said step of providing free electrons is performed so as to provide free electrons between said additional electrode and said counterelectrode.

19. A method as claimed in claim 18 wherein said step of providing free electrons includes providing at least one field emission electrode and maintaining the field emission electrode at a negative potential with respect to the counterelectrode.

20. A method as claimed in claim 19 wherein said at least one field emission electrode includes a plurality of field emission electrodes connected electrically in parallel.

21. A method as claimed in claim 19 wherein said additional electrode and said counterelectrode define substantially parallel surfaces so as to provide an electric field of substantially constant magnitude between said additional electrode and said counterelectrode.

22. A method as claimed in claim 1 wherein said step of providing an electric field includes providing a plurality of field emission electrodes having emitting regions cooperatively defining a surface and a counterelectrode spaced apart from said surface and maintaining said field emission electrodes at a negative potential with respect to said counterelectrode, and wherein and said free electrons are injected into the gas from said field emission electrodes.

23. A method as claimed in claim 22 wherein said plurality of field emission electrodes includes a plurality of point electrodes, said point electrodes having points disposed in a two-dimensional array and defining said surface.

24. Apparatus for forming excimers in a gas comprising:
(a) a chamber for holding a gas;
(b) means for providing free electrons in said gas; and
(c) means for imposing an electric field within a region of said gas so as to accelerate said free electrons, said electric field being configured so that (i) within a first region of said gas, said free electrons have mean energy equal to or greater than the excitation energy required to form the excimer and (ii) within at least one region of the gas, said free electrons have mean energy less than the ionization energy of the gas, whereby said free electrons excite the gas and form excimers without causing arcing.

25. Apparatus for forming excimers in a gas comprising:
(a) a chamber for holding a gas;
(b) an excimer-forming gas within said chamber;
(c) at least one field emission electrode which emits free electrons disposed within said chamber;
(d) a counterelectrode within said chamber remote from said field emission electrode; and
(e) a potential source having a negative terminal connected to said at least one field emission electrode and said a positive terminal connected to said counterelectrode for imposing an electric field within a region of said gas so as to accelerate said free electrons, said electric field being configured so that so that (i) within a first region of said gas, said free electrons have mean energy equal to or greater than the excitation energy required to form the excimer and (ii) within at least one region of the gas, said free electrons have mean energy less than the ionization energy of the gas, whereby said free electrons excite the gas and form excimers without causing arcing.

26. The apparatus of claim 25 wherein said field emission electrode includes a point electrode.

27. The apparatus of claim 25 wherein said electrode comprises a plurality of field emission electrodes.

28. The apparatus of claim 25 further comprising an additional electrode spaced apart from said counterelectrode.

29. The apparatus of claim 28 wherein said counterelectrode and said additional electrode are disposed at a substantially constant distance from one another.

30. The apparatus of claim 29 wherein said electrode consists of a thin blade.

31. Apparatus as claimed in claim 25 wherein said chamber has a wall transparent to electromagnetic radiation at an emission wavelength of excimers of said gas.

32. Apparatus as claimed in claim 25 wherein said chamber has a wall portion transparent to vacuum ultraviolet light.

33. Apparatus as claimed in claim 25 wherein said gas includes a first gas component selected from the group consisting of He, Ne, Ar, Kr, and Xe and mixtures thereof.

34. Apparatus as claimed in claim 33 wherein said gas consists essentially of said first gas component.

35. Apparatus as claimed in claim 34 wherein said gas includes a second gas component having a composition different from the composition of said first gas component.

36. Apparatus as claimed in claim 35 wherein said second gas component is selected from the group consisting of halogens and hydrogen.

37. Apparatus as claimed in claim 36 wherein said gas consists essentially of Ne and H.

38. Apparatus as claimed in claim 37 wherein said gas consists essentially of a mixture of at least two gases selected from the group consisting of He, Ne, Ar, Kr, and Xe and a halogen.

39. Apparatus as claimed in claim 25 wherein said gas has a pressure above about 0.1 bars.

40. Apparatus as claimed in claim 39 wherein said gas has a pressure above about 1 atmosphere.

* * * * *

UNITED STATES PATENT AND TRADEMARK OFFICE
CERTIFICATE OF CORRECTION

PATENT NO. : 6,400,089 B1
DATED : June 4, 2002
INVENTOR(S) : Manfred Salvermoser and Daniel E. Murnick It is certified that error appears in the above-identified patent and that said Letters Patent is hereby corrected as shown below:

Title page,
Item [57], ABSTRACT,
Line 12, "more a metal" should read -- more metal --.

Column 1,
Line 37, "VUv light" should read -- VUV light --.
Line 63, "the [electrons have] atom" should read -- the atom --.

Column 2,
Line 7, "$Kr_{2*}$ and $Xe_{2*}$" should read -- $Kr_2$ and $Xe_2$ --.

Column 4,
Line 12, "to as a" should read -- to as an --.
Line 32, "tip of creates" should read -- tip creates --.
Line 55, "area the" should read -- area of the --.

Column 5,
Line 35, "also ha s" should read -- also has --.

Column 6,
Line 8, "ore more" should read -- or more --.
Line 15, "excited to from" should read -- excited to form --.
Line 42, "is related is related" should read -- is related --.

Column 7,
Line 27, "where is touches" should read -- where it touches --.
Line 35, "formation (the" should read -- formation --.
Line 36, "so called) the" should read -- the --.
Line 67, "Utip" should read -- $U_{tip}$ --.

Column 8,
Line 37, "In another" should read -- Another --.

UNITED STATES PATENT AND TRADEMARK OFFICE
CERTIFICATE OF CORRECTION

PATENT NO. : 6,400,089 B1
DATED : June 4, 2002
INVENTOR(S) : Manfred Salvermoser and Daniel E. Murnick It is certified that error appears in the above-identified patent and that said Letters Patent is hereby corrected as shown below:

<u>Column 9,</u>
Line 38, "a bream of" should read -- a beam of --.

<u>Column 12,</u>
Line 12, "wherein and said" should read -- wherein said --.
Line 43, "so that so that" should read -- so that --.

Signed and Sealed this

Twenty-eighth Day of January, 2003

JAMES E. ROGAN
*Director of the United States Patent and Trademark Office*